United States Patent [19]

Fujii et al.

[11] Patent Number: 4,569,036

[45] Date of Patent: Feb. 4, 1986

[54] SEMICONDUCTOR DYNAMIC MEMORY DEVICE

[75] Inventors: Syuso Fujii, Kawasaki; Shozo Saito, Yokohama; Kenji Natori, Kamakura, all of Japan; Tohru Furuyama, Ithaca, N.Y.

[73] Assignee: Tokyo Shibaura Denki Kabushiki Kaisha, Japan

[21] Appl. No.: 470,627

[22] Filed: Feb. 28, 1983

[30] Foreign Application Priority Data

Feb. 26, 1982 [JP] Japan .................................. 57-28736

[51] Int. Cl.⁴ .............................................. G11C 13/00
[52] U.S. Cl. .................................... 365/230; 365/189
[58] Field of Search ........................ 365/94, 230, 189

[56] References Cited

U.S. PATENT DOCUMENTS

| 3,402,398 | 9/1968 | Koerner et al. | 365/230 |
| 3,731,287 | 5/1973 | Seely et al. | 365/189 |
| 3,753,242 | 8/1973 | Townsend | 365/94 |
| 4,044,341 | 8/1977 | Stewart et al. | 365/189 |

*Primary Examiner*—Terrell W. Fears
*Attorney, Agent, or Firm*—Finnegan, Henderson, Farabow, Garrett & Dunner

[57] ABSTRACT

A semiconductor dynamic memory device includes a plurality of memories, row decoders for selecting the row of the memories, column decoders for selecting the column of memories, and sense amplifier circuits connected to the memories, respectively. The dynamic memory device further has a driving circuit for selectively activating some of the sense amplifier circuits in accordance with the content of a predetermined bit of row address data supplied to the row decoders.

8 Claims, 9 Drawing Figures

SEMICONDUCTOR DYNAMIC MEMORY DEVICE

BACKGROUND OF THE INVENTION

The present invention relates to a semiconductor dynamic memory device.

Mass-production of 64K bit dynamic type random access memory devices (DRAMs) has been enabled by the recent development of semiconductor memory devices of high packing density. Furthermore, a 256K bit DRAM has been developed. In this case, in order to prevent an increase in stray capacitance and resistance of word lines and data lines, it is proposed to divide memory cells into a plurality of areas and to provide word lines, data lines and circuits such as sense amplifiers for each memory cell area.

Word lines and data lines in a highly integrated semiconductor memory device conventionally are formed to have narrow width. However, the stray capacitance per unit length of a word line or a data line is not greatly reduced. Furthermore, since the word lines and data lines are made narrow, resistance per unit length of a word line or data line increases. As a result, the delay time of a signal transmitted along the word line or data line is prolonged.

A dynamic random access memory (DRAM) as shown in FIG. 1 includes a memory 2 having a plurality of memory cells arranged in a matrix form, a plurality of pairs of aluminum folded data lines D0-1 and D1-1, D0-2 and D1-2, . . . , and D0-M and D1-M, each of which is connected to memory cells in a given column, word lines W1 to WN of polycrystalline silicon which are each connected to memory cells in a given row, a column decoder 4 connected to the folded data lines D0-1 and D1-1, . . . , and D0-M and D1-M, a row decoder 6 connected to the word lines W1 to WN, and a sense amplifier circuit 8 connected to the folded data lines D0-1 and D1-1, . . . , and D0-M and D1-M for sensing and amplifying data on the paired data lines. In FIG. 1, a hollow circle indicates a memory cell for storing data and a solid circle or dot indicates a dummy memory cell.

In the DRAM, when data is read out from one of the memory cells connected to the data line D0-1, the data line D0-1 and a selected word line are activated, and the data line D1-1 and the word line WN are also activated. These activated lines select a memory cell and a corresponding dummy cell for determining a potential difference between the data line D0-1 and D1-1. The sense amplifier circuit 8 determines the potentials of the data lines D0-1 and D1-1 according to the initial potential difference therebetween. The potentials on the data lines D0-1 and D1-1 are transmitted to an input/output circuit (not shown).

The DRAM shown in FIG. 2 includes four memory areas 2-1 to 2-4, each of which has the same configuration as the memory 2 shown in FIG. 1, a column decoder 4-1 commonly connected to the memory areas 2-1 and 2-2, a column decoder 4-2 commonly connected to the memory areas 2-3 and 2-4, a row decoder 6-1 commonly connected to the memory areas 2-1 and 2-3, a row decoder 6-2 commonly connected to the memory areas 2-2 and 2-4, and sense amplifier circuits 8-1 to 8-4 connected to the memory areas 2-1 to 2-4, respectively.

In a case where the DRAM shown in FIG. 2 is highly integrated so that the entire chip surface area thereof may be the same as that of the DRAM shown in FIG. 1, and each of the memory areas 2-1 to 2-4 has the same memory capacity as the memory 2 of the DRAM shown in FIG. 1, the DRAM can be formed such that the number of memory cells connected to the word line or data line will be the same, and the length of the word line or data line may be made shorter than that of the word or data line in the DRAM shown in FIG. 1. This shortens the delay time of a signal transmitted through the word line or data line, allowing faster data detection by each of the sense amplifier circuits 8-1 to 8-4 with greater accuracy. However, since the gate oxide film will be thinner due to the high packing density, the stray capacitance of the memory cells of each memory area 2-1 to 2-4 increases, thus adversely affecting the signal transmitted through the word line or data line. Furthermore, in the DRAM shown in FIG. 2, since two column decoders 4-1 and 4-2, two row decoders 6-1 and 6-2, and four sense amplifier circuits 8-1 to 8-4 operate simultaneously when performing read/write operations, the current consumed in charging or discharging the data lines increases greatly. This increase in current consumption raises chip temperature and adversely affects the operation of the DRAM. In particular, such a current has a peak, and changes the internal power source voltage, thereby degrading the operating speed.

FIG. 3 shows a detailed circuit diagram of the basic unit of the DRAM shown in FIG. 1. This circuit includes a sense amplifier 10 having a flip-flop circuit formed of MOS transistors TR1 and TR2 connected to bistable output nodes N1 and N2 and to a control line CL; the data line D0-1, one end of which is connected to the node N1 through a MOS transistor TR3 and the other end of which is connected to a reference voltage terminal VS through MOS transistors TR4 and TR5; and the data line D1-1, one end of which is connected to the node N2 through a MOS transistor TR6 and the other end of which is connected to the reference voltage terminal VS through MOS transistors TR7 and TR8. A MOS transistor TR9 is connected between the data line D0-1 and a power source terminal VD, and a MOS transistor TR10 is connected between the data line D1-1 and the power source terminal VD. A plurality of working memory cells MC0-1, MC0-2, . . . and so on are connected to the data line D0-1, and a plurality of memory cells MC1-1, MC1-2, . . . and so on are connected to the data line D1-1. Each memory cell is formed of a MOS transistor and a capacitor series-connected between the data line D0-1 or D1-1 and the reference voltage terminal VS. A capacitor C0-1 is connected between the reference voltage terminal VS and the junction of the MOS transistors TR4 and TR5. A capacitor C1-1 is connected between the reference voltage terminal VS and the junction of the MOS transistors TR7 and TR8. The MOS transistor TR4 and the capacitor C0-1 constitute a dummy memory cell. The MOS transistor TR7 and the capacitor C1-1 constitute another dummy memory cell. Each of the capacitors C0-1 and C1-1 has a capacitance of ½ that of the capacitor of a working memory cell. Furthermore, the data lines D0-1 and D1-1 are connected to input/output data lines DL0 and DL1 through MOS transistors TR11 and TR12, respectively. The MOS transistors TR11 and TR12 are used for column selection.

The read operation of the circuit shown in FIG. 3 will now be described with reference to signal waveforms shown in FIGS. 4A to 4E. Normally, a voltage signal $\phi C$ at a predetermined potential lever is supplied to the gates of the MOS transistors TR3 and TR6, which serve as resistor elements.

A signal $\phi P$ shown in FIG. 4B, which is substantially synchronous with a row address strobe signal $\overline{RAS}$ shown in FIG. 4A and supplied from an outer control circuit (not shown), is supplied to the gates of the MOS transistors TR9 and TR10 from a signal generating circuit (not shown). Then, the MOS transistors TR9 and TR10 are turned ON. Charging currents flow through the respective data lines D0-1 and D1-1 to keep the potential levels thereof equal to that of a power source voltage VD. Thereafter, the signal $\phi P$ falls substantially syncronously with the row address strobe signal $\overline{RAS}$. In this case, a signal $\phi D$ having the same waveform as the signal $\phi P$ is applied to the gates of the MOS transistors TR5 and TR8 to turn ON the MOS transistors TR5 and TR8 so as to discharge the capacitors C0-1 and C1-1.

Assume that the memory cell MC0-1 is selected. In this case, a word selection signal shown in FIG. 4C is supplied to the word line W1. Since the memory cell MC0-1 is connected to the data line D0-1, the word line W(N-1) connected to the gate of the MOS transistor TR7, which constitutes the dummy memory cell connected to the data line D1-1, is energized. This changes the voltage level of the data line D0-1 according to the data stored in the memory cell MC0-1; meanwhile the data line D1-1 is set to a predetermined potential. When the memory cell MC0-1 stores, for example, the bit value "1", the potential of the data line D0-1 is made higher than that of the data line D1-1. When the memory cell MC0-1 stores the bit value "0", the potential of the data line D0-1 is made lower than that of the data line D1-1. If a voltage signal $\overline{\phi S}$ supplied to the control line CL is set low under these conditions, the conduction states of the MOS transistors TR1 and TR2 are determined in accordance with the difference between the potentials of the data lines D0-1 and D1-1. As a result, the charge on one of the data lines D0-1 and D1-1 is discharged through the one of the MOS transistors TR1 and TR2 which is ON. Thus, a discharging current as shown in FIG. 4E flows. Then, a column selection signal (FIG. 4D) is supplied and voltage signals on the data lines D0-1 and D1-1 are transmitted to an outer circuit (not shown) through the MOS transistors TR11 and TR12 and through the input/output data lines DL0 and DL1.

After the data is read out in the manner described above the word selection signal, shown in FIG. 4C, is set to a low level and the signal $\overline{\phi S}$ is set to a high level.

The charging/discharging current shown in FIG. 4E occupies a large percentage of the operating current supplied to the DRAM. It flows when the signal $\phi P$ rises and the control signal $\phi S$ falls, as mentioned earlier, and has a sharp current peak. In a 64K bit DRAM, for example, a current peak as large as 100 mA occurs.

If all of a plurality of memory devices arranged on a memory board are operated simultaneously, noise generated by the current peak will be mixed in the power source voltage. This may cause erratic operation.

Furthermore, the current peak may lower the power source voltage or raise a ground potential level in the memory device, thereby causing instability in the operation of the memory device.

In a DRAM having a substrate bias generator, the substrate potential may be varied when the data lines are charged or discharged. This is because of an electrostatic coupling capacitance existing between the data lines and the substrate. The magnitude of the variation is generally about 1 V. If the DRAM is highly densely packed, the variation in the substrate potential increases since the capacitance between the data lines and the substrate increases.

In the conventional DRAM, it is required to refresh all of the memory cells only by the row address data without its most significant bit. Accordingly, in the DRAM shown in FIG. 2, the two memory areas 2-1 and 2-3 having the same row address or the two memory areas 2-2 and 2-4 having the same row address must all be activated at the same time. Even if the row addresses for the memory areas 2-1 and 2-3 are distinguished from those for the memory area 2-2 and 2-4 in terms of the most significant bit, the most significant bit is not included in address data for performing the refreshing operation, and therefore, all of the memory areas 2-1 to 2-4 are activated simultaneously during data refresh. As a result, it is required to operate all of the sense amplifier circuits 8-1 to 8-4 simultaneously, thereby increasing the current comsumption.

SUMMARY OF THE INVENTION

It is, therefore, an object of the present invention to provide a semiconductor dynamic memory device which operates stably at a high speed, in which the operating and peak currents are greatly reduced.

According to an aspect of the present invention, a semiconductor dynamic memory device is provided having $2^n$ (n is an integer of 2 or more) memory means including a plurality of memory cells arranged in a matrix form and a plurality of word lines and data lines connected to the memory cells; decoding means for selecting rows and columns of the $2^n$ memory means in accordance with address data; a plurality of sense amplifier circuits connected to the $2^n$ memory means for sensing and amplifying data on the data lines; and driving means for activating part of the plurality of sense amplifier circuits and maintaining the rest of the plurality of sense amplifier circuits in a non-active state, in accordance with the content of at least one bit signal included in the address data.

In each operation cycle of the present invention, a plurality of sense amplifier circuits can be selected according to the content of a single bit of the address data, for example, and the rest of the plurality of sense amplifier circuits are kept in the non-active state. Therefore, charging/discharging currents will not flow through the data lines connected to those sense amplifier circuits which are in the non-active state, and total current consumption and current peaks in the entire memory means are greatly reduced.

BRIEF DESCRIPTION OF THE DRAWINGS

FIG. 9 is a circuit diagram of a driver circuit used in the semiconductor dynamic memory device shown in FIG. 8.

DETAILED DESCRIPTION OF THE PREFERRED EMBODIMENT

Figure 1:
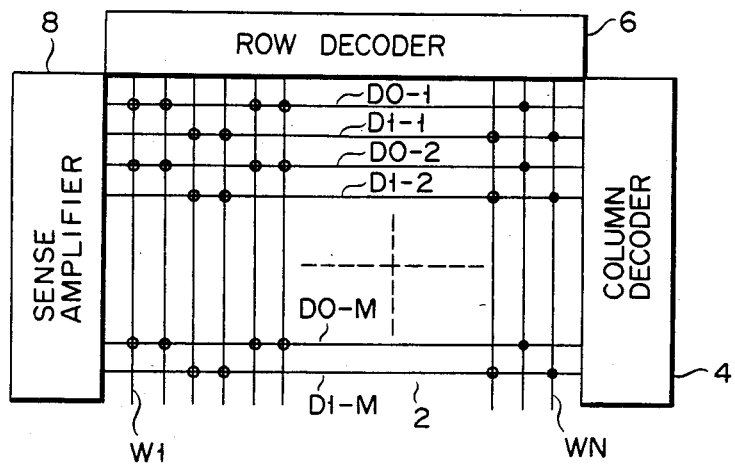
FIG. 1 shows a conventional dynamic type random access memory device.
Figure 3:
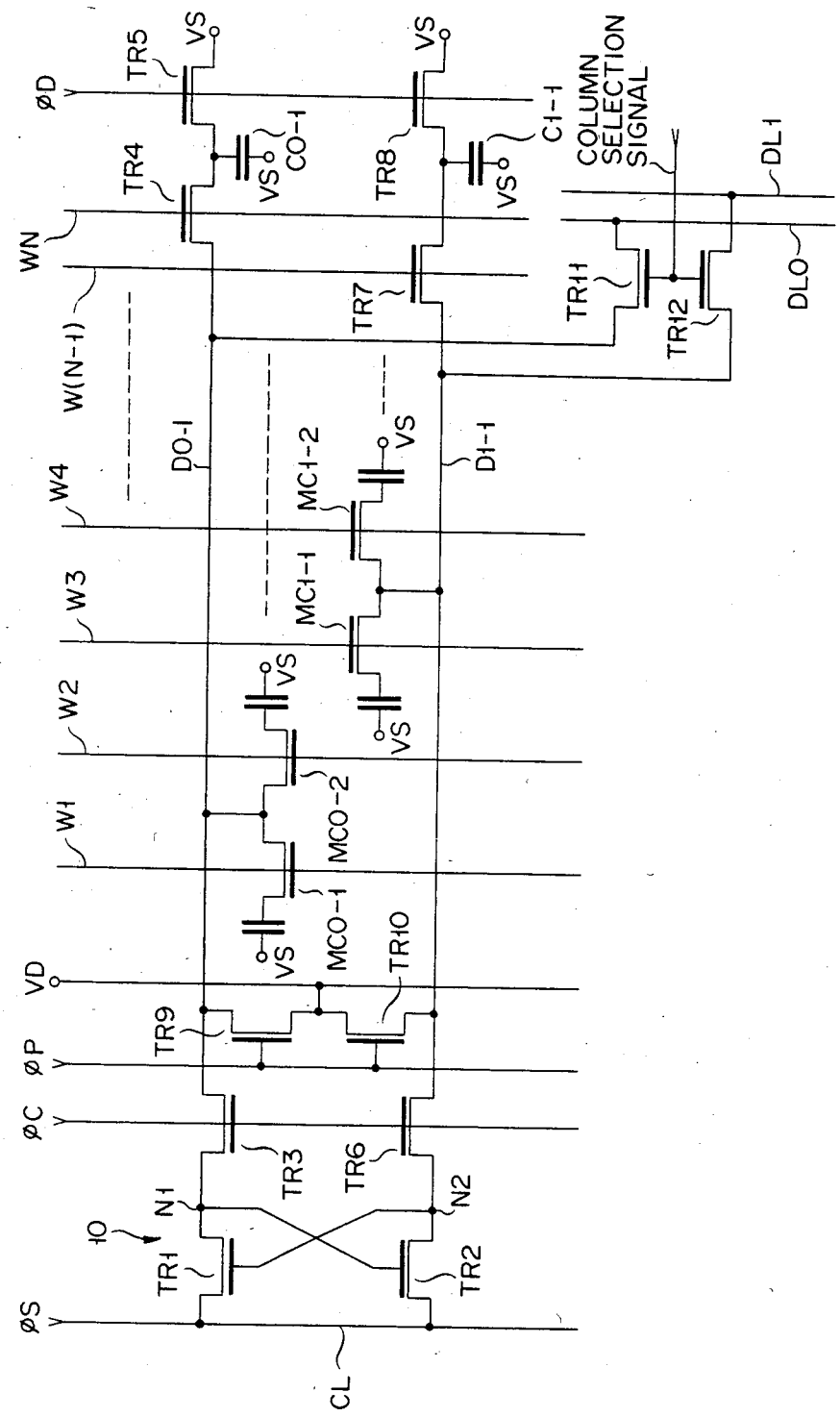
FIG. 3 shows a basic unit having a column of memory cells and a sense amplifier of the random access memory device shown in FIG. 1.
Figure 4:
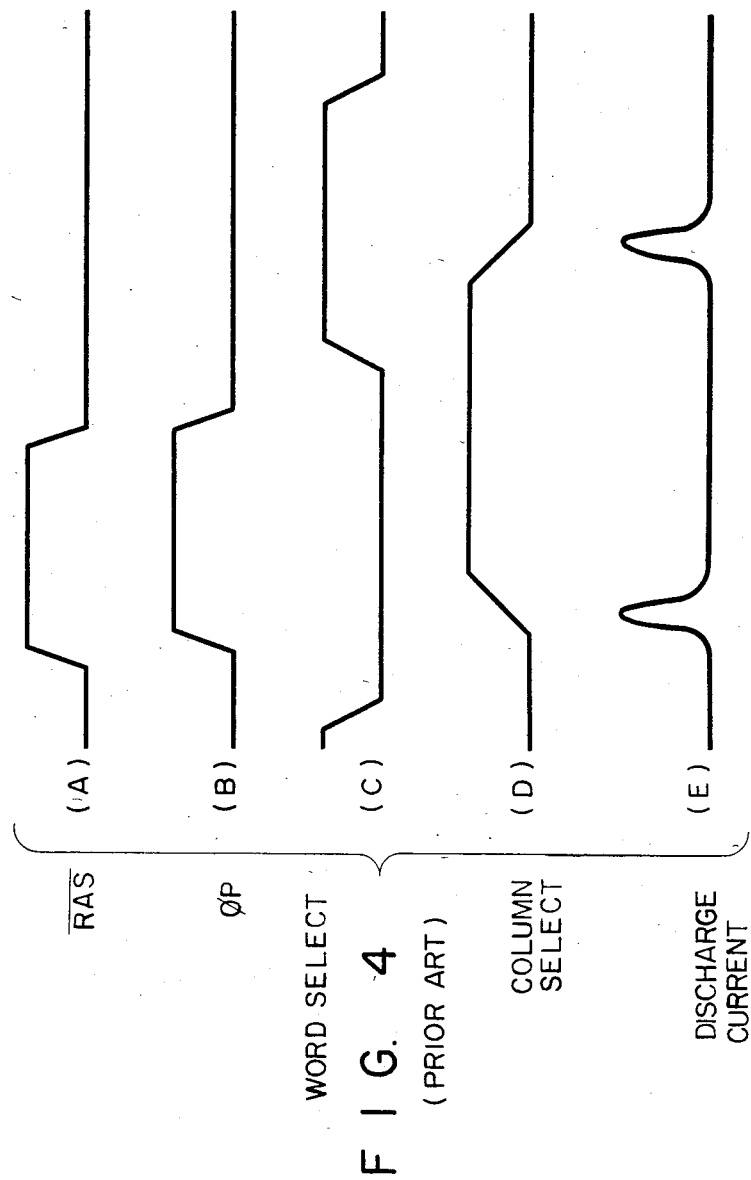
FIGS. 4A to 4E show signal waveforms for explaining an operation of the basic unit shown in FIG. 3.
Figure 5:
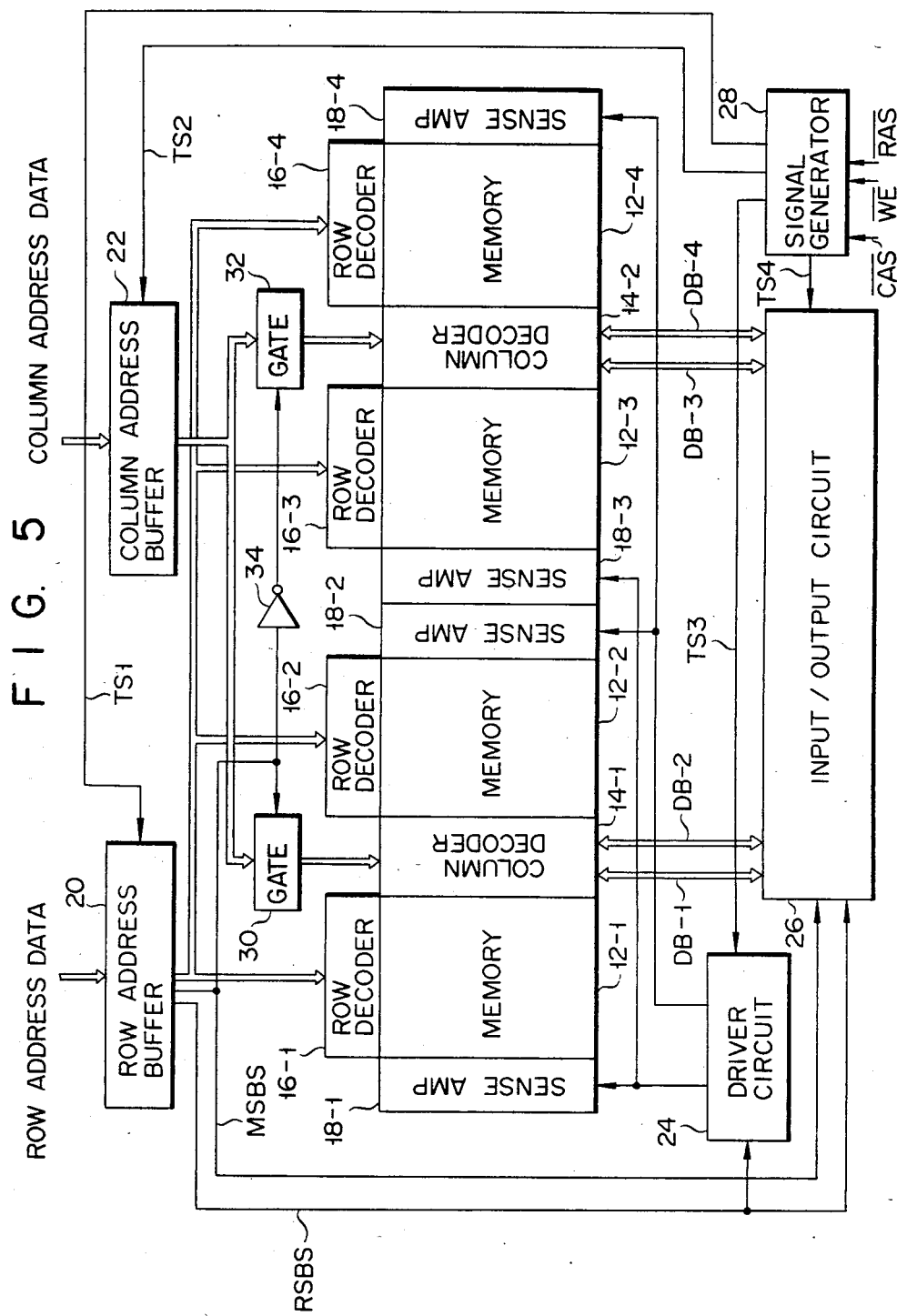
FIG. 5 is a block diagram of a semiconductor dynamic memory device according to a first embodiment of the present invention.

FIG. 5 shows a semiconductor dynamic memory device according to a first embodiment of the present invention. The dynamic memory device shown in FIG. 5 has four memories 12-1 to 12-4, each of which has a configuration similar to that of the memory devices shown in FIGS. 1 and 3; a column decoder 14-1 connected to the memories 12-1 and 12-2; a column decoder 14-2 connected to the memories 12-3 and 12-4; row decoders 16-1 to 16-4 connected to the memories 12-1 to 12-4, respectively; and sense amplifiers 18-1 to 18-4 connected to the memories 12-1 to 12-4, respectively. Furthermore, this dynamic memory device has row and column address buffers 20 and 22 for respectively storing row and column address data supplied from an address signal generator (not shown); a driver circuit 24 for selectively driving the sense amplifier circuits 18-1 to 18-4; an input/output circuit 26 connected to the column decoders 14-1 and 14-2 through data buses DB-1 to DB-4; and a control signal generator 28 for supplying timing signals TS1 to TS4 to the row and column address buffers 20 and 22, the driver circuit 24 and the input/output circuit 26, respectively, in response to a row address strobe signal $\overline{RAS}$, a column address strobe signal $\overline{CAS}$, and a write enable signal $\overline{WE}$.

Output data from the row address buffer 20 excluding the most significant bit MSB is supplied to the row decoders 16-1 to 16-4, and the output data from the column address buffer 22 is supplied to the column decoders 14-1 and 14-2 through gate circuits 30 and 32, respectively. The most significant bit signal MSBS from the row address buffer 20 is supplied directly to the gate circuit 30 and to the gate circuit 32 through an inverter 34. A randomly selected bit signal RSBS which is selected from the output data from the row address buffer 20 excluding the most significant bit signal MSBS is supplied from another ouput terminal thereof to the driver circuit 24. The most significant bit signal MSBS and the randomly selected bit signal RSBS are also supplied to the input/output circuit 26. Row addresses in the memories 12-1 and 12-2 are assigned in a similar way as row addressess in the memories 12-3 and 12-4, respectively.

Figure 6:
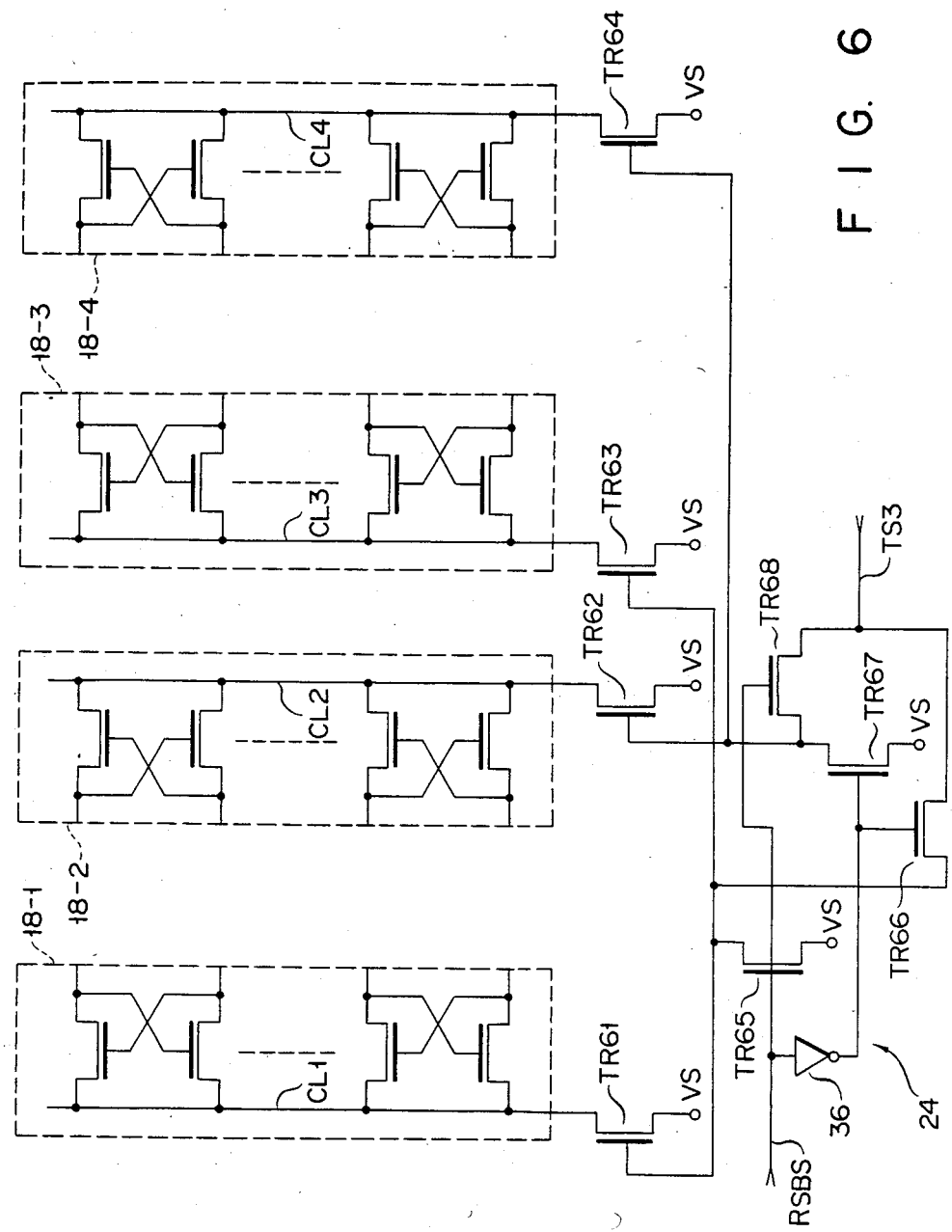
FIG. 6 is a circuit diagram of a sense amplifier circuit and a driver circuit of the semiconductor dynamic memory device shown in FIG. 5.

As shown in FIG. 6, the upper end of each of control lines CL1 to CL4 of the sense amplifier circuits 18-1 to 18-4, respectively, is connected to a power source terminal VD through a resistor element (not shown), and the other end of each control line is connected to a power source terminal VS through each of MOS transistors TR61 to TR64 of the driver circuit 24. The gates of the MOS transistors TR61 and TR63 are commonly connected to the power source terminal VS through a MOS transistor TR65, and also connected to receive the timing signal TS3 from the control signal generator 28 through a MOS transistor TR66. The gates of the MOS transistors TR62 and TR64 are commonly connected to the power source terminal VS through a MOS transistor TR67 and also connected to receive the timing signal TS3 from the control signal generator 28 through a MOS transistor TR68. The randomly selected bit signal RSBS is directly supplied to the gates of the MOS transistors TR65 and TR68, and to the gates of the MOS transistors TR66 and TR67 through an inverter 36.

Assume now that a bit signal RSBS is "0", and the MOS transistors TR66 and TR67 are turned ON. When the control signal TS3 is supplied under this condition, the MOS transistors TR61 and TR63 are turned ON to activate the sense amplifier circuits 18-1 and 18-3, respectively. On the other hand, when the bit signal RSBS is "1", the MOS transistors TR62 and TR64 are turned ON in response to the timing control signal TS3 to activate the sense amplifier circuits 18-2 and 18-4, respectively.

The operation of the dynamic memory device shown in FIGS. 5 and 6 will now be described with reference to FIGS. 7A to 7E.

Figure 7:
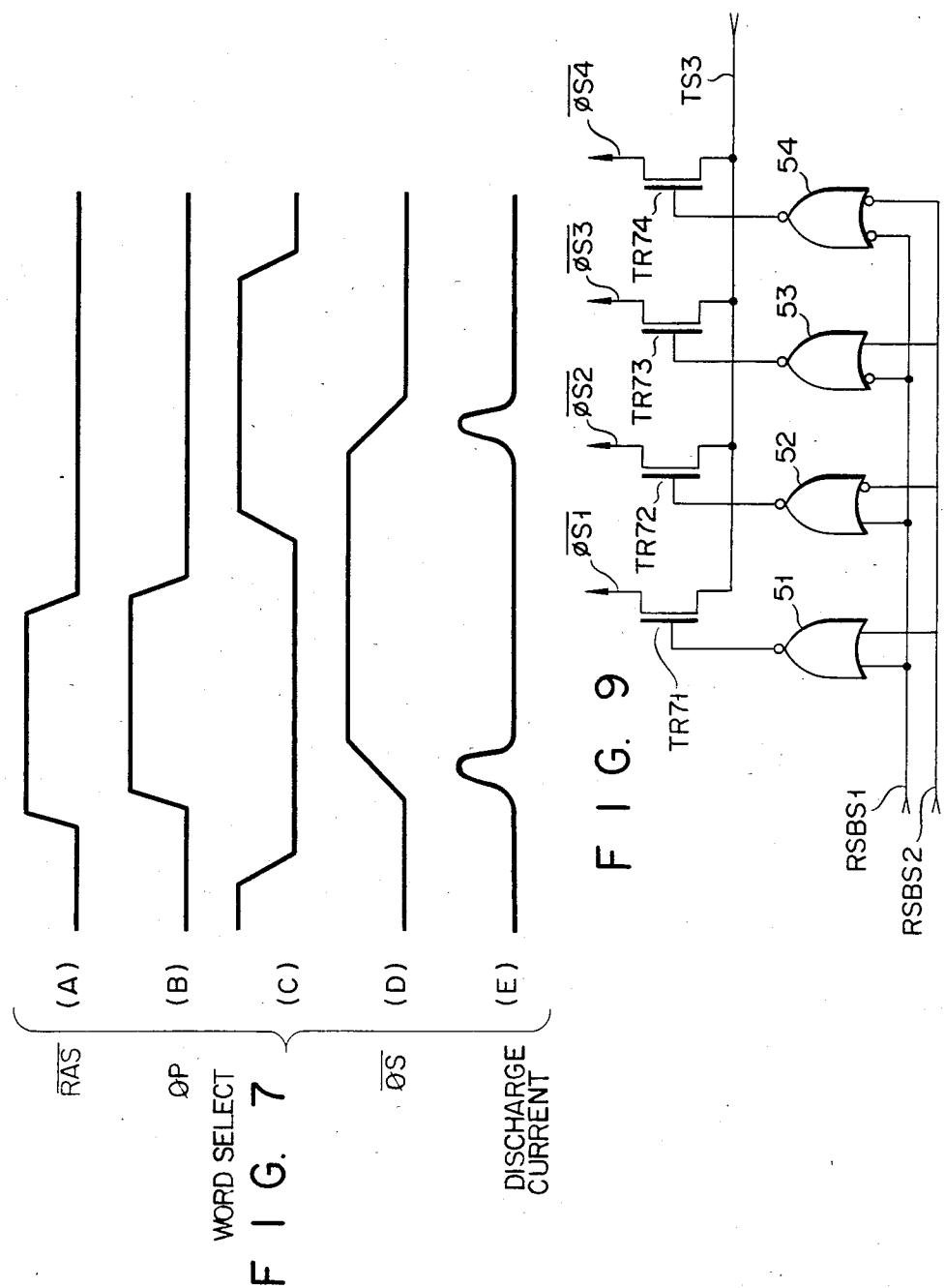
FIGS. 7A to 7E show signal waveforms for explaining an operation of the semiconductor dynamic memory device shown in FIGS. 5 and 6.

A case will be discussed where row address data which represents a row address (Ri) and includes the most significant bit of "1" and a randomly selected bit of "0" is supplied to the row address buffer 20 from an outer control circuit (not shown), and column address data which represents a column address (Cj) is supplied to the column address buffer 22. The control signal generator 28 supplies the signal $\phi P$ shown in FIG. 7B to the memories 12-1 to 12-4 in response to the row address strobe signal $\overline{RAS}$ (FIG. 7A) in a manner similar to that explained with reference to FIG. 3. This causes the potentials of all the data lines to be set at the power source voltage VD. Furthermore, the control signal generator 28 supplies a timing signal TS1 to the row address buffer 20 in accordance with the row and column address strobe signals $\overline{RAS}$, $\overline{CAS}$ and a write enable signal $\overline{WE}$ from the outer control circuit. The row address buffer 20 thus generates the row address data. The row address data from the row address buffer 20 excluding the most significant bit is supplied to the row decoders 16-1 to 16-4. Row address (R1i) and (R3i) of the memories 12-1 and 12-3, respectively, are selected and word selection signals shown in FIG. 7C are supplied to the corresponding word lines.

Thereafter, the column address buffer 22 generates the column address data to the gate circuits 30 and 32 in response to a timing signal TS2 from the control signal generator 28. Since the most significant bit signal MSBS is at a logic level of "1" and the gate circuit 30 is enabled, the column address data from the column address buffer 22 is supplied to the column decoder 14-1 through the gate circuit 30 so that column addresses (C1j) and C2j) of the memories 12-1 and 12-2, respectively, are selected. A memory cell at the addresses (R1i, C1j) in the memory unit 12-1 is thus selected.

Meanwhile, since the randomly selected bit signal RSBS of logic level "0" is supplied to the driver circuit 24, the MOS transistors TR65 and TR68 are turned OFF and the MOS transistors TR66 and 67 are turned ON. Under this condition, the MOS transistors TR61 and TR63 are turned ON in response to the timing signal TS3 from the control signal generator 28. The lower level signal $\phi S$ shown in FIG. 7D is supplied to the control lines CL-1 and CL-3 of the sense amplifier circuits 18-1 and 18-3, respectively. As a result, the sense amplifier circuits 18-1 and 18-3 are activated to discharge one of each pair of data lines of memories 12-1 and 12-3 connected to the sense amplifiers 18-1 and 18-3, respectively, thereby causing a discharging current to flow as shown in FIG. 7E. In this case, the potentials of a selected pair of data lines in the memory 12-1 is determined in accordance with data stored in the memory cell at the addresses (R1i, C1j) of the memory 12-1. The data of the memory cell is supplied to the input/output circuit 26 through the data bus DB-1 in a manner similar to that explained with reference to the FIG. 3. The input/output circuit 26 discriminates from which memory among the memories 12-1 to 12-4 the input data is transferred in accordance with the contents of the most significant bit signal MSBS and the randomly selected bit signal RSBS. Simultaneously, the input/output circuit 26 transfers the input data to the outer circuit (not shown) in response to a timing signal TS4 from the control signal generator 28.

Since the MOS transistor TR67 is ON in the above described readout operation, the sense amplifier circuits 18-2 and 18-4 are not activated even if the timing signal TS3 is generated from the control signal generator 28. Accordingly, all of the paired data lines of the memory units 12-2 and 12-4 connected to the sense amplifiers 18-2 and 18-4 are kept charged at the power source voltage VD. In other words, the discharging current does not flow in the data lines of the memories 12-2 and 12-4. In addition, in the next readout operation cycle, even if the signal $\phi P$ is supplied to the memories 12-1 to 12-4 substantially synchronously with the row address strobe signal $\overline{RAS}$, all of the data lines of the memories 12-2 and 12-4 are kept at the power source voltage VD. As a result, the charging current does not flow in any data lines.

Figure 2:
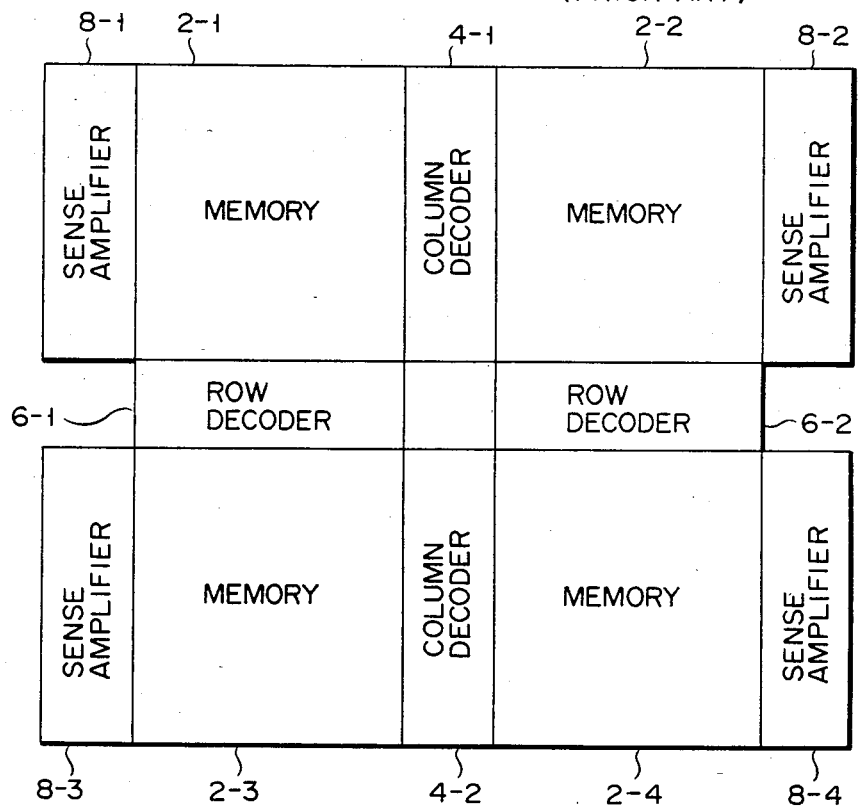
FIG. 2 shows a conventional dynamic type random access memory device having a memory divided into four areas.

As mentioned above, in the dynamic memory device shown in FIG. 5, only the sense amplifier circuits 18-1 and 18-3 or the sense amplifier circuits 18-2 and 18-4 are activated, and other two sense amplifier circuits are not activated. The total charging/discharging current flowing in the data lines of the memories 12-1 to 12-4 is much smaller than that flowing in the data lines of the memories 2-1 to 2-4 shown in FIG. 2. Therefore, the erratic operation due to the current peak, mentioned earlier, is greatly reduced.

Figure 8:
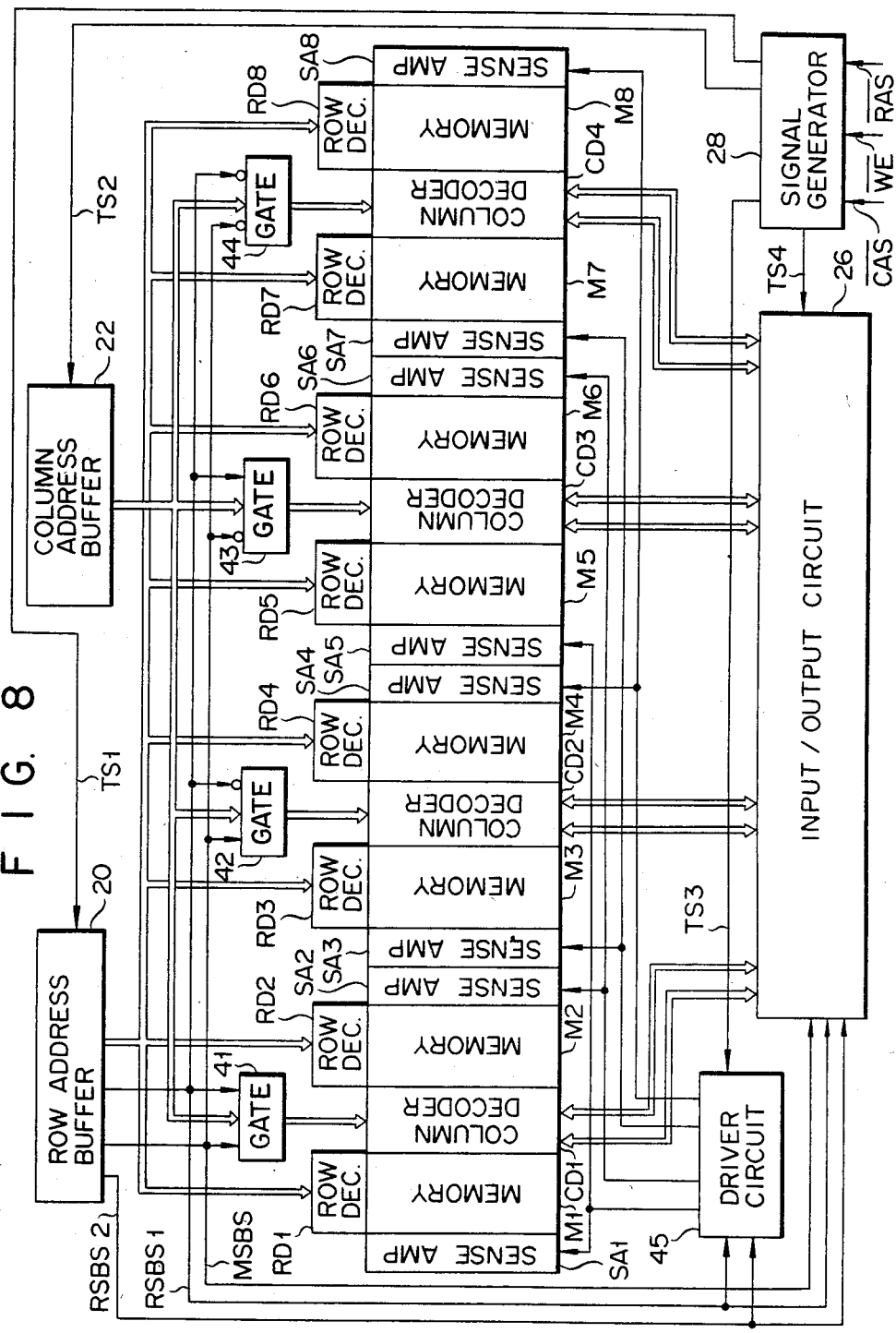
FIG. 8 is a block diagram of a semiconductor dynamic memory device according to a second embodiment of the present invention.

FIG. 8 shows a semiconductor dynamic memory device according to a second embodiment of the present invention, wherein eight memories M1 to M8, eight row decoders RD1 to RD8 connected to the memories M1 to M8 in the same manner as that shown in FIG. 5, four column decoders CD1 to CD4, and eight sense amplifiers SA1 to SA8 are included. Row address data from a row address buffer 20 excluding the most significant bit signal MSBS is supplied to the row decoders RD1 to RD8. Column address data from a column address buffer 22 is supplied to the column decoders CD1 to CD4 through gate circuits 41 to 44, respectively. For example, the memories M1, M3, M5 and M7 commonly have the same row and column addresses and the memories M2, M4, M6 and M8 commonly have the same row and column addresses.

The row address buffer 20 supplies two randomly selected bit signals RSBS1 and RSBS2 to a driver circuit 45. These two randomly selected bit signals RSBS1 and RSBS2 are included in the row address data excluding the most significant bit. The driver circuit 45 has NOR gates 51 to 54 connected to receive bit signals RSBS1 and RSBS2, RSBS1 and $\overline{RSBS2}$, $\overline{RSBS1}$ and RSBS2, and $\overline{RSBS1}$ and $\overline{RSBS2}$, respectively; and MOS transistors TR71 to TR74 whose gates are respectively connected to receive output signals from the NOR gates 51 to 54 and which are connected at one end to receive the timing control signal TS3 from the control signal generator 28. The other ends of the MOS transistors TR71 to TR74 are connected to the sense amplifier circuits SA1 and SA5, SA2 and SA6, SA3 and SA7, and SA4 and SA8, respectively. When both the randomly selected bit signals RSBS1 and RSBS2 are at a logic level "1" and when the timing control signal TS3 is supplied from the control signal generator 28, the driver circuit 45 supplies a signal $\overline{\phi S1}$ of logic level "0" to the sense amplifier circuits SA1 and SA5 so as to activate the sense amplifier circuits SA1 and SA5. In this case, other sense amplifiers SA2, SA3, SA4, SA6, SA7 and SA8 are not activated.

The bit signals MSBS and RSBS1; MSBS and $\overline{RSBS1}$; $\overline{MSBS}$ and RSBS1 and $\overline{MSBS}$ and $\overline{RSBS1}$ are supplied to the gate circuits 41 to 44, respectively. This enables, for example, only the gate circuit 41 when both the bit signals MSBS and RSBS1 are at a logic level "1", so as to supply the column address data from the column address buffer 22 to the column decoder CD1. In other words, the sense amplifier circuits, and gate circuits and the memories are selected as shown in the following table, in accordance with the bit signals MSBS, RSBS1 and RSBS2.

TABLE 1

| MSBS | 1 | 1 | 1 | 1 | 0 | 0 | 0 | 0 |
|---|---|---|---|---|---|---|---|---|
| RSBS1 | 1 | 1 | 0 | 0 | 1 | 1 | 0 | 0 |
| RSBS2 | 1 | 0 | 1 | 0 | 1 | 0 | 1 | 0 |
| SENSE AMP | SA1 SA5 | SA2 SA6 | SA3 SA7 | SA4 SA8 | SA1 SA5 | SA2 SA6 | SA3 SA7 | SA4 SA8 |
| Gate Circuit | 41 | 41 | 42 | 42 | 43 | 43 | 44 | 44 |
| Memory | M1 | M2 | M3 | M4 | M5 | M6 | M7 | M8 |

As mentioned above, in each operation of the second embodiment as well, only two of the sense amplifier circuits SA1 to SA8 are activated, and the total charging current flowing when the signal $\phi P$ rises and the total discharging current flowing when the output signals $\overline{\phi S1}$, $\overline{\phi S2}$, $\overline{\phi S3}$ or $\overline{\phi S4}$ fall are greatly reduced.

Although the present invention has been described with reference to its preferred embodiments, it is to be understood that the invention is not limited to these particular embodiments.

For example, in the dynamic type semiconductor memory device shown in FIG. 5, it is possible to omit the AND circuits 30 and 32, and to provide a selection circuit in the input/output circuit 26 so as to select one of memories 12-1 and 12-3 or one of memories 12-2 and 12-4 in response to the bit signal MSBS.

What we claim is:
1. A semiconductor dynamic memory device comprising:
 $2^n$, n being an integer of not less than 2, memory means each including a plurality of memory cells substantially arranged in a matrix form, and a plurality of word lines and data lines connected to said memory cells;
 decoding means for selecting rows and columns of said $2^n$ memory in accordance with N-bit, N being an integer larger than n, row address data and M-bit column address data, said N-bit row address data including n-bit address data which is selec- tively determined to designate a corresponding one of said $2^n$ memory means;

a plurality of sense amplifier circuits connected to said $2^n$ memory, respectively, for sensing and amplifying data on said data lines; and driving means for selectively activating a predetermined number of said sense amplifier circuits in accordance with the content of m, m being a positive integer smaller than n, bit data included in said n-bit address data and keeping the rest of said plurality of sense amplifier circuits in a non-active state.

2. A semiconductor dynamic memory device according to claim 1, wherein said decoding means includes $2^n$ row decoding circuits respectively connected to said $2^n$ memory means and each connected to receive row address data, $2^{(n-1)}$ column decoding circuits each connected to two of said $2^n$ memory means, and logic means connected to permit column address data to be selectively transferred to said $2^{(n-1)}$ column decoding circuits.

3. A semiconductor dynamic memory device according to claim 2, wherein n is set at 2, and said logic means permits the column address data to be selectively transferred to said $2^{(n-1)}$ column decoding circuits in accordance with the value of the most significant bit in said row address data.

4. A semiconductor dynamic memory device according to claim 3, wherein said driving means includes selection means for selecting two of said $2^n$ sense amplifier circuits in accordance with the value of a predetermined bit in said row address data.

5. A semiconductor dynamic memory device according to claim 2, wherein said driving means includes selection means for selecting two of said $2^n$ sense amplifier circuits in accordance with the value of a predetermined bit in said row address data.

6. A semiconductor dynamic memory device according to claim 2, wherein n is set at 3, and said logic means permits the column address data to be selectively transferred to said $2^{(n-1)}$ column decoding circuits in accordance with the value of the most significant bit and the value of a predetermined bit in said row address data.

7. A semiconductor dynamic memory device according to claim 6, wherein said driving means includes selection means for selecting two of said $2^n$ sense amplifier circuits in accordance with the value of said predetermined bit and the value of another predetermined bit in said row address data.

8. A semiconductor dynamic memory device according to claim 2, wherein said driving means includes selection means for selecting two of said $2^n$ sense amplifier circuits in accordance with the value of said predetermined bit and the value of another predetermined bit in said row address data.

* * * * *